US010877093B2

(12) United States Patent
Kawoosa et al.

(10) Patent No.: US 10,877,093 B2
(45) Date of Patent: *Dec. 29, 2020

(54) NON-INTERLEAVED SCAN OPERATION FOR ACHIEVING HIGHER SCAN THROUGHPUT IN PRESENCE OF SLOWER SCAN OUTPUTS

(71) Applicant: TEXAS INSTRUMENTS INCORPORATED, Dallas, TX (US)

(72) Inventors: Mudasir Shafat Kawoosa, Karnataka (IN); Rajesh Kumar Mittal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/117,644

(22) Filed: Aug. 30, 2018

(65) Prior Publication Data
US 2018/0372798 A1 Dec. 27, 2018

Related U.S. Application Data

(63) Continuation of application No. 15/042,130, filed on Feb. 11, 2016, now Pat. No. 10,088,525.

(51) Int. Cl.
*G01R 31/3177* (2006.01)
*G01R 31/3185* (2006.01)
(Continued)

(52) U.S. Cl.
CPC ..... *G01R 31/3177* (2013.01); *G01R 31/2851* (2013.01); *G01R 31/31713* (2013.01);
(Continued)

(58) Field of Classification Search
CPC .......... G01R 31/3177; G01R 31/31713; G01R 31/31723; G01R 31/2851
See application file for complete search history.

(56) References Cited

U.S. PATENT DOCUMENTS

| | | |
|---|---|---|
| 5,526,365 A | 6/1996 | Whetsel |
| 2003/0112051 A1 | 6/2003 | Wakayama |

(Continued)

OTHER PUBLICATIONS

"Joint Test Action Group", Wikipedia, available at https://en.wikipedia.org/w/index.php?title=Joint_Test_Action_Group&oldid=689139361 on Feb. 1, 2016, pp. 1-10.

*Primary Examiner* — Thien Nguyen
(74) *Attorney, Agent, or Firm* — Michelle F. Murray; Charles A. Brill; Frank D. Cimino

(57) ABSTRACT

A scan chain may be formed throughout an integrated circuit in which the scan chain is coupled to a set of pins via bi-directional input/output (I/O) buffers. A test pattern may be received from an external tester using the set of I/O pins and buffers operating in parallel. The test pattern is scanned into the scan chain using a shift clock operating at a first rate. The test pattern is then provided to combinatorial logic circuitry coupled to the scan chain. A response pattern is captured in the scan chain and then scanned from the scan chain using a shift clock operating at a second rate that is slower than the first rate. The response pattern is provided to the external tester using the same set of I/O pins and buffers operating in parallel.

18 Claims, 4 Drawing Sheets

(51) Int. Cl.
*G01R 31/28* (2006.01)
*G01R 31/317* (2006.01)

(52) U.S. Cl.
CPC .............. *G01R 31/31723* (2013.01); *G01R 31/318572* (2013.01); *G01R 31/318594* (2013.01)

(56) References Cited

U.S. PATENT DOCUMENTS

| | | | |
|---|---|---|---|
| 2007/0011542 A1* | 1/2007 | Mukherjee | G01R 31/318541 |
| | | | 714/738 |
| 2008/0250288 A1* | 10/2008 | Souef | G01R 31/318594 |
| | | | 714/731 |
| 2009/0132879 A1* | 5/2009 | Gangappa | G01R 31/318572 |
| | | | 714/729 |
| 2010/0070810 A1* | 3/2010 | Whetsel | G01R 31/31721 |
| | | | 714/731 |
| 2010/0162060 A1 | 6/2010 | Chakravarty | |
| 2011/0264970 A1 | 10/2011 | Whetsel | |
| 2013/0159801 A1 | 6/2013 | Whetsel | |
| 2014/0013176 A1 | 1/2014 | Whetsel | |
| 2014/0237312 A1 | 8/2014 | Gorti | |
| 2015/0036783 A1* | 2/2015 | Chen | G01R 31/318544 |
| | | | 377/19 |
| 2015/0198967 A1 | 7/2015 | Wang | |
| 2015/0309116 A1 | 10/2015 | Whetsel | |
| 2017/0234925 A1* | 8/2017 | Kawoosa | G01R 31/2851 |
| | | | 714/727 |

\* cited by examiner

NON-INTERLEAVED SCAN OPERATION FOR ACHIEVING HIGHER SCAN THROUGHPUT IN PRESENCE OF SLOWER SCAN OUTPUTS

CROSS-REFERENCE TO RELATED APPLICATIONS

This application is a continuation of U.S. patent application Ser. No. 15/042,130, filed Feb. 11, 2016, incorporated herein by reference.

FIELD OF THE INVENTION

This disclosure relates to testing of an integrated circuit, and more particularly to a scan chain with shared input/output pins in order to reduce shift time.

BACKGROUND OF THE INVENTION

Scan architectures are commonly used to test digital circuitry in integrated circuits (IC). Typical scan architectures scan in a test pattern, perform an operation with the test pattern and capture the results, then scan out the results while scanning in the next test pattern in an overlapped fashion. In many low power IC designs, the output buffers are restricted to lower speed operation in order to save power. The total test time is therefore limited by the scan speed determined by the output buffers.

BRIEF DESCRIPTION OF THE DRAWINGS

Particular embodiments in accordance with the invention will now be described, by way of example only, and with reference to the accompanying drawings.

Figure 1:
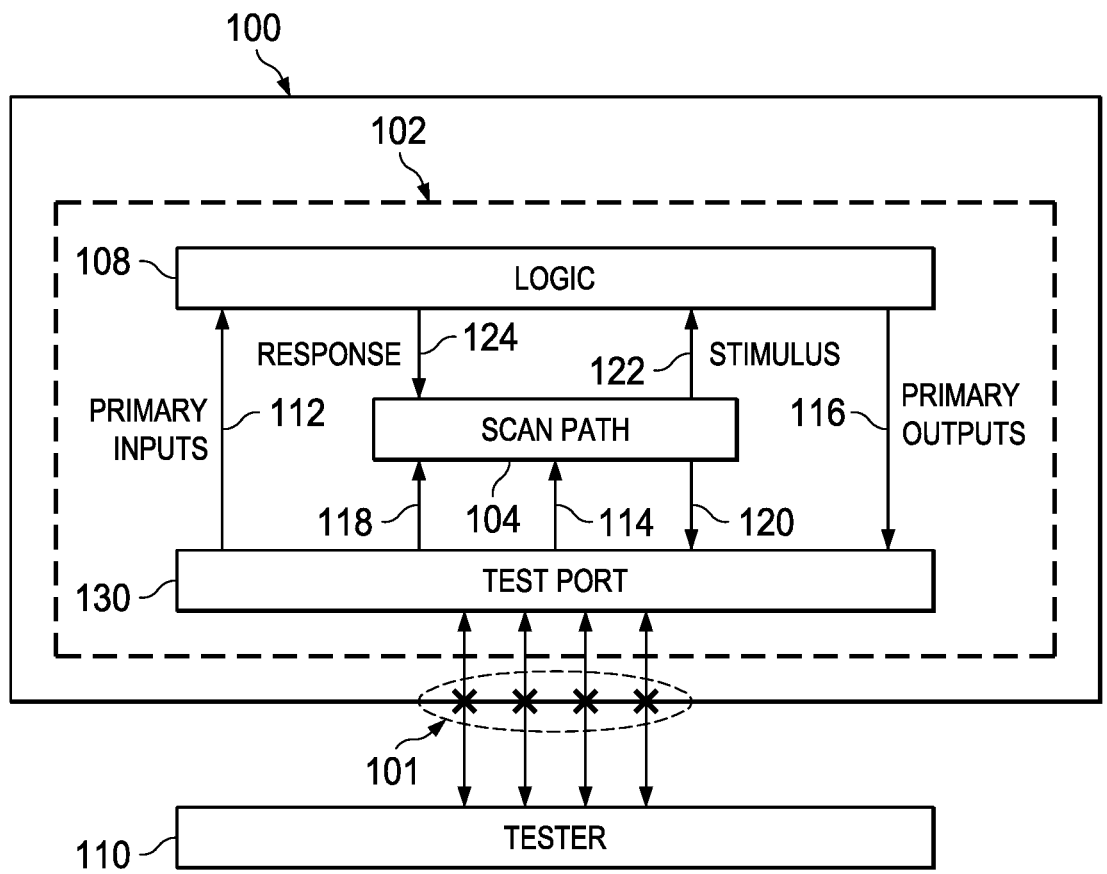
FIG. 1 is a block diagram of a circuit with a scan path.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Scan architectures are commonly used to test digital circuitry in integrated circuits. As will be described in more detail below, the present disclosure describes a method of adapting conventional scan architectures into a—high speed scan architecture in which output drive strength may limit the output scan rate and thereby increase test time. Embodiments of the disclosure may make use of a non-interleaved scan procedure along with asymmetric compressor de-compressor (CoDec) architecture where all available scan pins act as inputs during the scan load mode while the same scan pins are operated as scan outputs during the scan unload procedure. The transition from input to output mode may be controlled by an internal logic module that works on the basis of sequence/pattern detection logic. In some embodiments, a partial serializer may be used, while in other embodiments a serializer may not be needed. The method exploits the fact that while scan outputs may be slower, when operating as scan inputs an input port may operate at a significantly higher frequency, which may be as high as possible in terms of automatic test equipment (ATE) capabilities and/or other design requirements. Therefore, scan input data may be loaded at a higher frequency while scan output data may be unloaded at a maximum frequency which the IOs (inputs/outputs) can handle. In this manner, test time may be reduced.

FIG. 1 illustrates a simplified view of a scan architecture that illustrates how circuitry 102 within an integrated circuit 100 may be configured into a scan chain during test. In the normal functional configuration, circuit 102 may be a functional circuit within IC 100, but in test configuration it may appear as shown in FIG. 1. Scan architectures can be applied at various circuit levels. For example, the scan architecture of FIG. 1 may represent the testing of a complete IC, or it may represent the testing of an embedded intellectual property (IP) core sub-circuit within an IC, such as a DSP (digital signal processor) or CPU (central processing unit) core sub-circuit. The scan architecture may include a scan path circuit 104, logic circuitry to be tested 108, and connection paths 112, 114, 116, 118, 120 to a tester 110 via a test port 130. Tester 110 operates to: (1) output control to operate scan path 104 via control path 114; (2) output serial test stimulus patterns to scan path 104 via scan input path 118; (3) input serial test response patterns from scan path 104 via scan output path 120; (4) output parallel test stimulus patterns to logic 108 via primary input path 112; and (5) input parallel test response patterns from logic 108 via primary output path 116. Scan path 104 operates to output parallel test stimulus patterns to logic 108 via path 122, and to input parallel response patterns from logic 108 via path 124.

Typically tester 110 may be interfaced to the scan architecture by probing the die pads at wafer level, or by contacting package pins generally indicated at 101 that couple to test port 130 after the die is assembled into a package, for example.

While tester 110 connections to the primary inputs 112 and primary outputs 116 of logic 108 are shown, the primary input and output connections may be achieved by augmentation of scan path 104. For example, scan path 104 could be lengthened to include boundary scan cells located on each primary input and primary output of logic 108. The boundary scan cells would provide primary inputs to and primary outputs from logic 108, via widened stimulus and response busses 122 and 124, respectively. In some instances, logic 108 may be sufficiently tested by scan path 104 such that it is not necessary to provide primary inputs to and outputs from logic 108 via the tester or via the above described augmentation of scan path 104. For example, if the amount of logic 108 circuitry made testable by the use of scan path 104 in combination with the primary inputs and outputs is very small compared to the amount of logic 108 circuitry made testable by the scan path 104 alone, then the primary input and output connections to logic 108 may be removed without significantly affecting the test of logic circuitry 108. To simplify the description of the present disclosure, it will be assumed that logic circuit 108 is sufficiently tested using only scan path 104, i.e. the primary inputs 112 and primary outputs 116 are not required. However, it is clear that primary input and output connections to the tester or to an augmented scan path 104, as described above, could be used as well.

Figure 2:
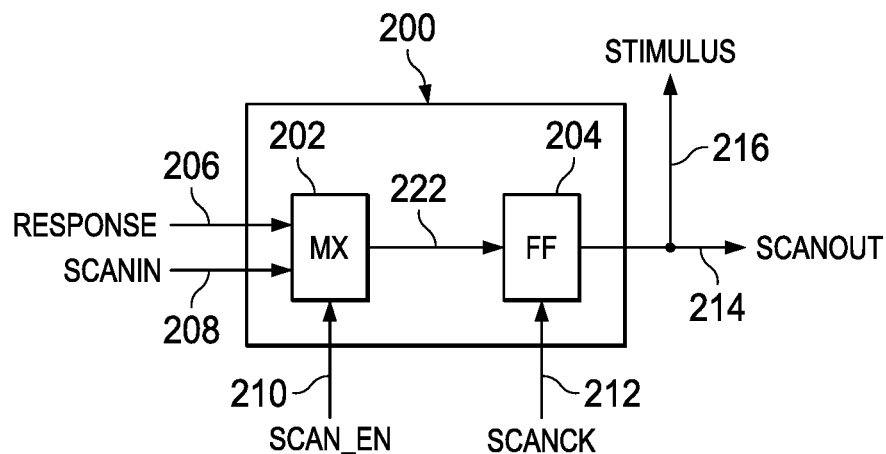
FIG. 2 is a block diagram of a scan cell.

FIG. 2 illustrates an example of a typical scan cell that may be used in scan path 104. The scan cell may include a flip-flop (FF) 204 and a multiplexer 202. During normal configuration of the circuit 100, multiplexer 202 and FF 204 receive control inputs SCAN_EN 210 and SCANCK 212 to input functional data from logic 108 via path 206 and output functional data via path 216. In the normal configuration, the SCANCK to FF 204 is typically a functional clock, and the SCAN_EN signal is set such that the FF always clocks in functional data from logic 108 via path 206. During a sequence of scan testing, multiplexer 202 and FF 204 receive control inputs SCAN_EN 210 and SCANCK 212 to capture test response data from logic 108 via path 206, shift data from scan input path 208 to scan output path 214, and apply test stimulus data to logic 108 via path 216. In the test configuration, the SCANCK to FF 204 is the test clock and the SCAN_EN signal is operated to allow capturing of response data from logic 108 and shifting of data from scan input 208 to scan output 214. During test configuration, SCAN_EN may be controlled by tester 110 via path 114. SCANCK may also be controlled by the tester, or it may be controlled by another source, for example a functional clock source. For the purpose of simplifying the operational description, it will be assumed that the SCANCK is controlled by the tester.

The scan inputs 208 and scan outputs 214 of multiple scan cells are connected to form the serial scan path 104. The stimulus path 216 and response path 206 of multiple scan cells in scan path 104 form the stimulus bussing path 122 and response bussing path 124, respectively, between scan path 104 and logic 108. From this scan cell description, it is seen that the FF is shared between being used in the normal functional configuration and the test configuration. During scan operations through scan path 104, the stimulus outputs 216 from each scan cell ripple, since the stimulus 216 path is connected to the scan output path 214. This ripple may cause all the inputs to logic 108 to actively change state during scan operations. Rippling the inputs to logic 108 causes power to be consumed by the interconnect and gating capacitance in logic 108.

Referring back to FIG. 1, scan controller 130 may be any one of many types of scan controller circuits. Two examples of some of the types of scan controllers that could be represented by scan controller 130 are briefly discussed below.

In one realization, scan controller 130 may represent a test access port (TAP) controller circuit of IEEE standard 1149.1, A Standard Test Access Port and Boundary Scan Architecture, commonly referred to as JTAG (Joint Test Action Group). Alternatively, test port 130 may conform to IEEE 1149.7, which is a reduced pin count version of 1149.1. A brief description of JTAG 1149.1 and 1149.7 is provided by "Joint Test Action Group", Wikipedia, as of Nov. 5, 2015, which is incorporated by reference herein.

In another realization, scan controller 130 may represent a boundary input/output serializer (BIOS) circuit, described in regard to FIG. 17 of U.S. Pat. No. 5,526,365, being used to control scans access to parallel scan paths. The description in U.S. Pat. No. 5,526,365 is incorporated herein by reference.

In another embodiment, another known or later developed test access port design may be used.

Today, there are a number of test synthesis vendor tools that can synthesize and insert scan architectures into ICs, similar in structure to the scan architecture shown in FIG. 1. The use of such "push-button" scan insertion tools is an attractive alternative to customized scan designs since it is an automated process. As will be described, the present disclosure provides a method of adapting these synthesized scan architectures such that they may operate in a desired-high speed mode with slow speed I/Os. The process of adapting scan architectures for low power operation with shared IO pins is also easily automated.

Figure 3:
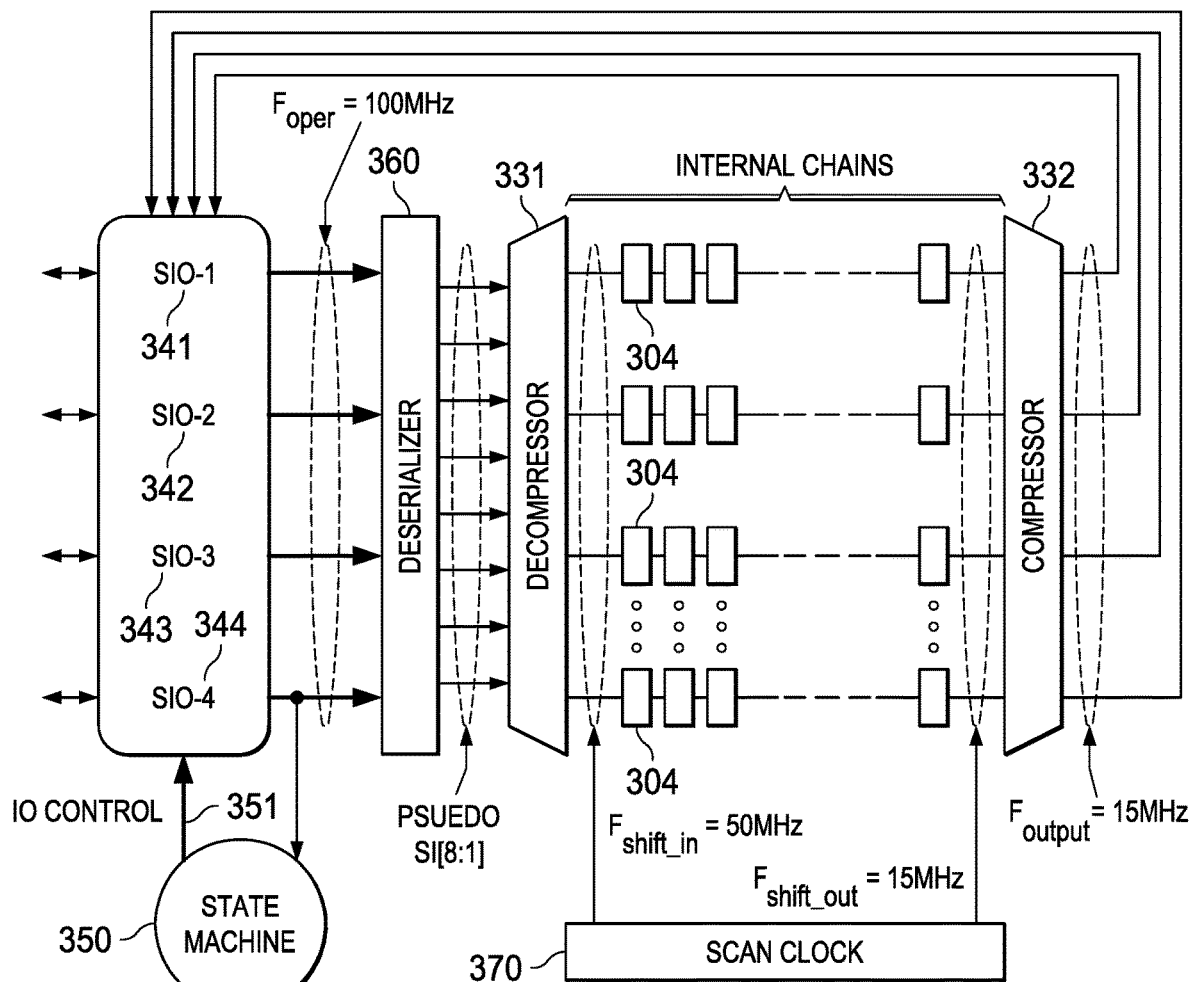
FIG. 3 is a more detailed diagram of the scan path of FIG. 1.

FIG. 3 is a more detailed diagram of the scan path of FIG. 1 in which details allowing two different modes of scan operation are illustrated. In this example, decompressor logic 331 and compressor logic 332 may be part of test port 130, referring back to FIG. 1. Decompressor logic 331 receives a stream of data and control signals from an external test system, such as tester 110 in FIG. 1 and separates the stream into the different data and control paths 112, 114, and 118 illustrated in FIG. 1, based on the test protocol supported by test port 130. In a similar manner, compressor 132 receives the data paths 116 and 120 and combines them into a data stream that is provided to the external test system, such as tester 110. As described in more detail above, the protocol used to compress and decompress the test pattern data and results data may be a currently known protocol, such as IEEE 1149.1, 1149.7, BIOS, etc., or a later developed protocol.

Various known or later developed techniques may be used for a test pattern compression/decompression. For example, various type of encoding may be used, such as: statistical codes, run-length codes, or Golomb codes. Other implementations may be based on XOR networks, hybrid patterns, EDT (Embedded Deterministic Test), or reuse of scan chains, for example. Other implementations may be based on test pattern compaction and/or overlapping, for example. The test patterns may be compressed by an external tester or ATPG and then decompressed by decompressor 331 using one technique, while the result data may be compressed by compressor 332 using the same or a different compression technique.

Typically, a scan chain may contain several dozen, several hundred, or even several thousand scan cells. Typically, a long chain may be divided into several smaller chains that are then each coupled to decompressor 331 and compressor 332 and operate in parallel, as illustrated here. In this example, only four scan cells are illustrated in each scan chain 304 for simplicity, but it should be understood that each scan chain 304 may include several tens or hundreds of scan cells similar to scan cell 200.

In this example, four pins and related buffer circuitry 341-344 on the integrated circuit are allocated for scan IO buffers. All four scan pins may be used to scan in a test pattern during a first phase of a scan test under control of IO control signal 351. As the test pattern data is transferred from tester 110 to IC 100, a deserializer 360 may be used to divide each stream of test pattern data received on each input buffer 341-344 into two separate streams of data in order to form eight streams of test pattern data that are provided to decompressor 331 in this example. Decompressor 331 then parcels the test pattern data to the various scan chains 304 where it is then shifted through each scan chain by asserting the SCAN_EN signal 210 while the scan clock 212 operates for a period of time, referring back to FIG. 2.

Once an entire pattern of test data is scanned into the scan chains 304, then the SCAN_EN signal 210 may be deasserted and one or more cycles of the scan clock 212 may be performed to cause response data from logic 108 to be loaded into the scan path. A sufficient number of clock cycles are performed during each test to input all stimuli to and to obtain all response from logic 108. During each test interval, the number of clock cycles may be just one for performing stuck-at testing, or two or more for performing sequential at-speed testing.

After a response from logic 108 has been captured in scan chains 304, the response data may then be scanned out by again asserting the SCAN_EN signal 210 and operating the scan clock 212 for a period of time. Compressor 332 may be used to compress the response data from multiple scan chains 304 down to just four streams of response data in this example. The IO buffers 341-344 are configured by IO control signal 351 to operate as output buffers during the scan out process.

A state machine 350 internal to IC 100 may be used to control the operation of the IO buffers. State machine 350 may be implemented in different manners, depending on how test pins are allocated on IC 100. In some embodiments, an external test pin may be allocated for the SCAN_EN signal 210 which allows tester 110 to control this signal. If the SCAN_EN pin is external then, then state machine 350 may detect an assertion edge of SCAN_EN and then configure the IO buffers into input mode. When an external tester wants to unload the scan chain, the external tester may de-assert the SCAN_EN signal and state machine 350 may then configure the IO buffers into output mode.

If the SCAN_EN signal does not have an allocated external test pin, then during first time when the device enters into scan test mode, such as after a reset operation, the IO buffers may be place in the input mode. State machine 350 may then monitor one or more of the input test pattern streams until a designated test pattern is observed and then configure the IO buffers as output buffers in response to detecting the designated pattern. A counter 352 internal to state machine 350, or otherwise accessible to state machine 350, may then be used to count a predefined number of cycles to determine when a shift out operation is complete. At that point, state machine 350 may then toggle the IO control signal 351 to again configure the IO buffers into input mode. While the IO buffers are in input mode, state machine 350 may again monitor the test pattern data stream for one or more designated patterns that may signify a particular action or mode of operation for state machine 350 to initiate.

Figure 4:
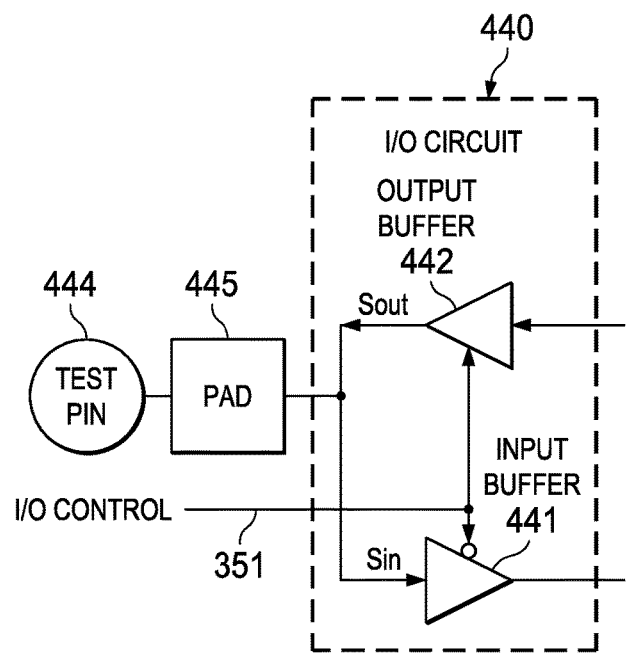
FIG. 4 is a more detailed circuit diagram of an example IO buffer.

FIG. 4 is a more detailed circuit diagram of an example bi-directional IO buffer 440 that may be representative of any of IO buffers 341-344. In this example, input buffer 441 is a tri-state device that is active when IO control signal 350 is low, while output buffer 442 is a tri-state device that is active when IO control signal 350 is high. The input of buffer 441 and the output of buffer 442 may be coupled to pad 445, which is a bond pad on IC 100. Test pin 444 is an external pin on IC 100 that is coupled to bond pad 445.

While simple tri-state buffers are illustrated in FIG. 4, other known or later developed IO buffers may be used for IO buffers 341-344. In some embodiments, the input buffer may remain active at all time, with only the output buffer being enabled and disable, for example. While IO control signal 351 is illustrated as being high to enable output buffer 442 and low to enable input buffer 441, in another embodiment this may be reversed.

The propagation delay through a buffer typically includes an "inertial delay" component. Inertial delay is a function of capacitive load being driven and resistivity of the buffer as it tries to charge the capacitive load. In low power ICs, the drive capacity of the output buffers may be limited in order to conserve operating power. However, the input buffers may see a very small load and therefore may be able to operate at a significantly higher speed than the output buffers. Embodiments of this disclosure may take advantage of the inherent speed advantage of the input buffers.

Figure 5:
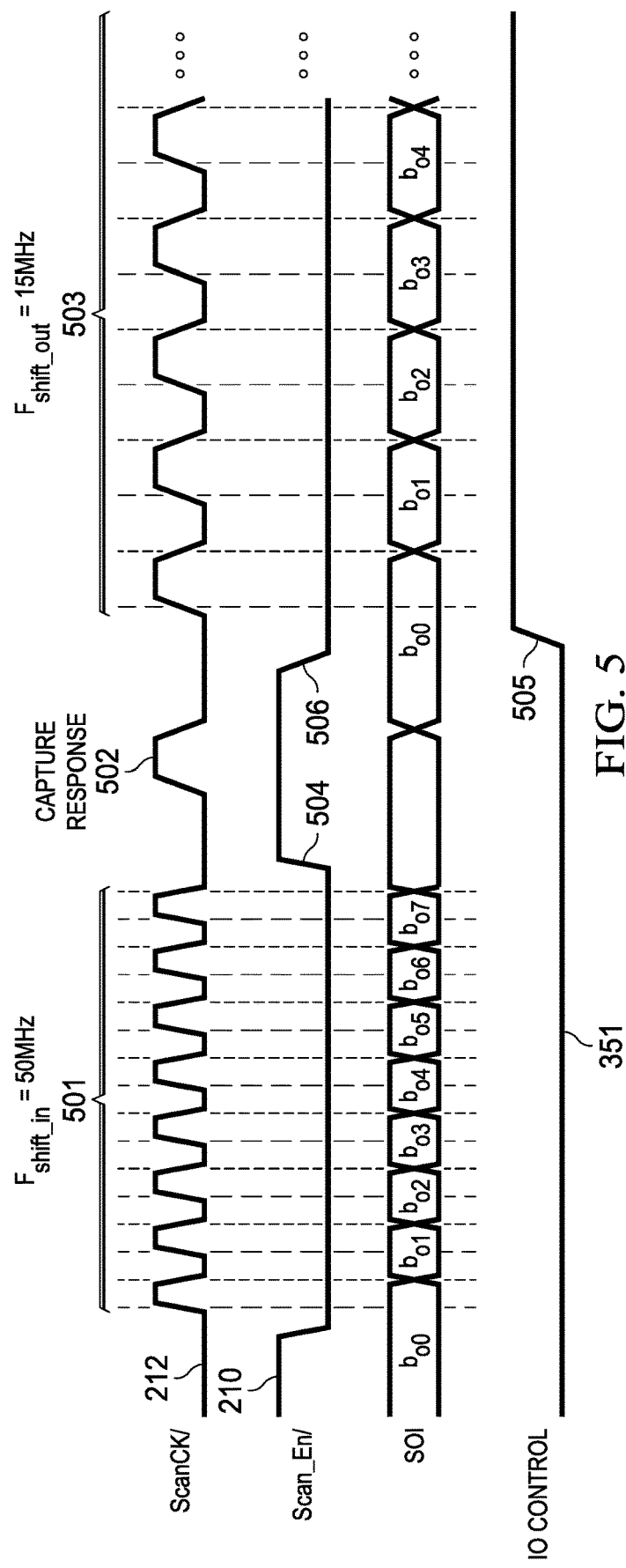
FIG. 5 is a timing diagram of operation of the scan chain circuit of FIG. 3.

FIG. 5 is a timing diagram of operation of the scan chain circuit of FIG. 3. In this example, the scan enable signal 210 may be asserted (set to a low logic level) for a period of time 501 by tester 110, or by internal state machine 350, as described above in more detail. During time period 501, IO control signal 351 configures the IO buffers 341-344 to be in an input mode. Scan test pattern data may then be placed on the four test pins of IC 100 and scan clock 212 may then scan in the test pattern data to scan chains 304, referring again to FIG. 3.

Since the input buffers are lightly loaded and on the input side the relative delay between clock and data rather than absolute delay through the input buffers determine clocking rate, data received on the test pins may be clocked at a high rate. For example, referring again to FIG. 3, data may be received at a rate of 100 MHz on the four external test pins, deserialized into eight streams at 50 MHz, and then shifted into eight scan chains using a scan clock 370 operating at 50 MHz. While eight bits of data during time period 501 are illustrated here for clarity, typically a larger number of test pattern data bits will be included in each sequence.

Once a complete test pattern is scanned into the scan chains 304, then the scan enable signal 210 may be deasserted, either under control of external tester 110 or under control of internal state machine 350, and one or more clock cycles performed during time period 502. As described above, one or more clock cycles may be used to capture a set of result data.

The scan enable signal 210 is then again asserted during time period 503, IO control signal 351 is set to configure IO buffers 341-344 into the output mode, and the scan clock 212 is cycled to scan out the results data to the external tester. Referring back to FIG. 3, the results data may be shifted out from the scan chains at a slower scan clock frequency, such as 15 MHz, for example, from the scan clock 370.

Table 1 illustrates a comparison between a conventional scan chain operation in which the load and unload operations are overlapped and the improved mechanism described herein in which the load and unload operations are not overlapped. As described above in more detail, during overlapped operation, the overall frequency of operation may be limited by the speed of the output buffers. During non-overlapped operation, the load operation can proceed at the maximum speed of the input buffers using all of the test pins, while during the unload operation all of the test pins may be used at the lower speed of the output buffers. Compared to the conventional method the proposed method provides around 25-40% improvement in test time, depending on the ratio k of load frequency to unload frequency. Using an asymmetric CoDec architecture along with an optional partial de-serializer, all compressor outputs may be brought out directly on IOs. During the non-overlapped input, a 4:8 de-serializer may reduce the internal shift frequency to half of the external shift clock. Both these features may add to the test time savings.

scanned in test pattern, the captured result data is then scanned out using all four test pins operating at 15 MHz, which takes approximately 338 ms. In this example, the total test time is approximately 440 ms, which is approximately 35.5% faster than the overlapped example.

TABLE 1

Comparison of Test Times between overlapped and non-overlapped operation, with a 4:8 deserializer

|  | Overlapped | Non-overlapped | k = 1 | k = 2 | k = 3 | k = 4 | k = 5 |
|---|---|---|---|---|---|---|---|
| External Load Frequency | F | kF | F | 2 F | 3 F | 4 F | 5 F |
| External Unload Frequency | F | F | F | F | F | F | F |
| Internal Load Frequency | F/2 | kF | F | 2 F | 3 F | 4 F | 5 F |
| Internal Unload Frequency | F/2 | F | F | F | F | F | F |
| Load Time | na | T/k | T | 0.5 T | 0.33 T | 0.25 F | 0.2 F |
| Unload time | 2 T | T | T | T | T | T | T |
| Test Time | 2 T | T/k + T | 2 T | 1.5 T | 1.33 T | 1.25 T | 1.2 T |
| Savings (%) | NA | (2 T − (T/k + T))/2 T = (k − 1)/2 k | 0 | 25 | 33 | 37 | 40 | where: T is the time to unload the scan chains, and k is the ratio of load frequency vs. unload frequency Table 2 provides an example of test times between overlapped and non-overlapped operation for in IC that has four test pins allocated for scan data. The details of the non-overlapped operation are illustrated in FIG. 3. As shown in Table 2, when overlapped operation is performed, two test pins are used for data input and two test pins are used for data output. Assuming the output buffers are limited to about 15 MHz operation, then it will take approximately 665 ms to unload 40,000 bits of response data from the scan chains. A test pattern for the next test is scanned in during the unload process, so on average the load and unload times overlap. In this case, the total test with a 40,000 bit pattern takes approximately 668 ms.

TABLE 2

Example of Test Times between overlapped and non-overlapped operation, with a 4:8 deserializer

|  | Overlapped | Non-overlapped |
|---|---|---|
| External Load Frequency | 30 MHz | 100 MHz |
| External Unload Frequency | 15 MHz | 15 MHz |
| Internal Load Frequency | 7.5 MHz (133 ns/bit) | 50 MHz |
| Internal Unload Frequency | 7.5 MHz (133 ns/bit) | 15 MHz |
| Pattern count | 40000 | 40000 |
| Chain length | 128 scan cells/chain | 128 scan cells/chain |
| Load Time | 665 ms | 102.4 ms |
| Unload time | 665 ms overlapped | 337.82 ms |
| Test Time | 668 ms | 440.32 ms |
| Savings (%) |  | 35.5% |

Figure 6:
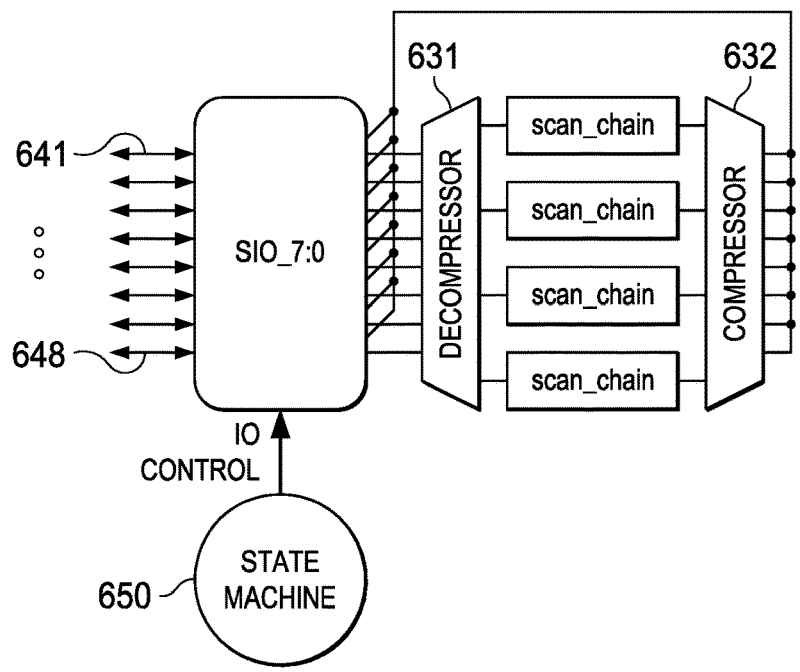
FIG. 6 is a block diagram of a scan path using eight test pins.

Using the non-overlapped mechanism described herein, loading of the 40,000 bit test pattern may use all four test pins. Assuming the tester as capable, the test pattern may be loaded using an external frequency of 100 MHz. The 4:8 deserializer then converts the data rate to 50 MHz which is used as the shift in clock frequency, resulting in a load time of approximately 102 ms. After performing a test using the FIG. 6 is a block diagram of a scan path using eight test pins with shared IO buffers, as indicated at 641-648. In this example with eight input pins, a deserializer is not provided. Decompressor 631 receives eight streams of test pattern data from test pins 641-648 and provides them to the scan chains. Compressor 632 then receives captured test result data and provides eight streams to the test pins 641-648 when they are configured as output buffers by state machine 650, as described in more detail above.

Figure 7:
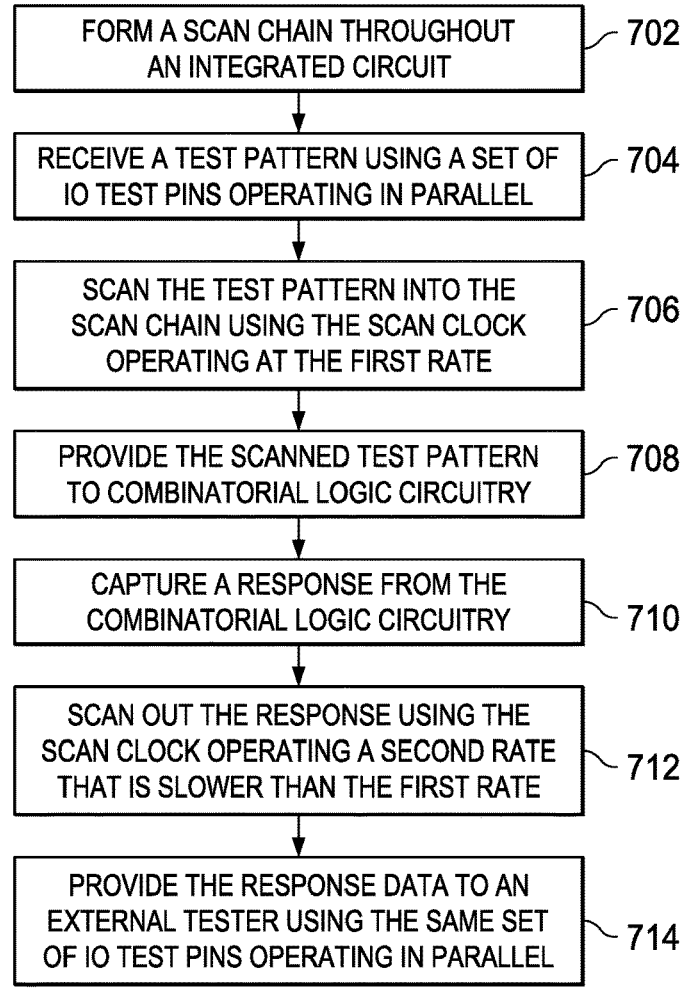
FIG. 7 is a flow diagram illustrating non-overlapped operation of a scan chain.

FIG. 7 is a flow diagram illustrating non-overlapped operation of a scan chain in an integrated circuit. A scan chain is formed 702 throughout the integrated circuit as described above in more detail with regard to FIGS. 1-6.

A test pattern is received 704 from an external tester, such as tester 110 referring to FIG. 1, for the scan chain at a test port on the integrated circuit using a set of input/output (I/O) pins operating in parallel. In various embodiments there may be four scan data pins, such as IO pins 341-344 with regard to FIG. 3, eight IO pins 641-648 with regard to FIG. 6, or fewer or more pins, for example.

A test pattern is scanned 706 into the scan chain using a shift clock operating at a first rate. A de-serializer may be provided to divide the test pattern streams received on the external test pins into additional streams. For example, a 4:8 deserializer such as deserializer 360 may produce eight streams of test pattern data from four streams received on four input buffers 341-344.

The test pattern is provided 708 to combinatorial logic circuitry coupled to the scan chain, such as logic 108 referring to FIG. 1.

A response pattern to the test pattern from the logic circuitry is captured 710 in the scan chain. As described above, one or multiple clock cycles may be performed to identify "stuck at" problems or speed related problems, for example.

The response pattern is scanned 712 from the scan chain using a shift clock operating at a second rate that is slower than the first rate. For example, in the example illustrated in FIG. 3, the scan in rate is 50 MHz, while the scan out rate is 15 MHz.

The response pattern is provided 714 to the external tester using the same set of I/O pins operating in parallel. In this manner, the test pattern may be shifted in using all of the test scan pins and the response pattern may be shifted out using all of the test scan pins.

The non-overlapped scheme described herein allows full sharing of all of the data scan pins allocated to a test port on an IC, without the need for any bi-directional control from the external tester. The rate of loading test patterns and unloading captured test results are independent and may be selected based on the capability of the input buffer and the output buffer. No additional control signal toggling with a clock cycle is needed.

The non overlapped scheme may be scaled for use with as few as two data pins up to however many data pins are available.

The overlapped scheme is compatible with current automatic test equipment (ATE) used for semiconductor processing.

Other Embodiments

While the invention has been described with reference to illustrative embodiments, this description is not intended to be construed in a limiting sense. Various other embodiments of the invention will be apparent to persons skilled in the art upon reference to this description. For example, while "flip flops" were used to describe the elements of a scan chain, various types of state saving circuitry may also be used as an element in a scan chain. For example, the following types of flip flops are typical: D type, JK, RS, T (toggle), etc.

While logic 108 was described herein as "combinatorial", there may be various latches, registers, or other state saving circuitry included within logic 108 in various embodiments.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit, comprising:
    an input/output buffer, configured to receive stimulus data;
    a state machine coupled to the input/output buffer, the state machine configured to control whether the input/output buffer operates as an input buffer or an output buffer;
    a logic circuit configured to generate response data in response to the stimulus data; and
    a scan path coupled between the input/output buffer and the logic circuit, the scan path configured to:
        apply the stimulus data to the logic circuit; and
        apply the response data to the input/output buffer; and
    wherein the input/output buffer is configured to output the response data.

2. The integrated circuit of claim 1, further comprising:
    a decompressor coupled between the input/output buffer and the scan path; and
    a compressor coupled between the scan path and the input/output buffer.

3. The integrated circuit of claim 2, further comprising a deserializer coupled between the input/output buffer and the decompressor.

4. The integrated circuit of claim 1, wherein the state machine is coupled to an external test pin, wherein the state machine is configured to configure the input/output buffer to operate as the input buffer in response to detecting an assertion of the external test pin.

5. The integrated circuit of claim 4, wherein the state machine is coupled to an external test pin, wherein the state machine is configured to configure the input/output buffer to operate as the output buffer in response to detecting de-assertion of the external test pin.

6. The integrated circuit of claim 1, further comprising a counter coupled to the state machine, wherein the input/output buffer initially operates as the output buffer, the counter configured to count a number of cycles of the stimulus data received from the input/output buffer, the state machine configured to transition the input/output buffer to operate as the input buffer in response to determining that the counter reaches a predefined number of cycles.

7. The integrated circuit of claim 1, wherein the state machine comprises a counter, wherein the input/output buffer initially operates as the output buffer, the counter configured to count a number of cycles of stimulus data received from the input/output buffer, the state machine configured to transition the input/output buffer to operate as the input buffer in response to determining that the counter reaches a predefined number of cycles.

8. The integrated circuit of claim 1, wherein the input/output buffer initially operates as the input buffer, the state machine configured to transition the input/output buffer to operate as the output buffer in response to detecting a designated patter in the input/output buffer.

9. The integrated circuit of claim 1, wherein the scan path is further configured to:
    receive the stimulus data from the input/output buffer, based on a first clock signal from a scan clock, the first clock signal at a first clock rate; and
    scan the response data, based on a second clock signal from the scan clock, the second clock signal at a second clock rate, the second clock rate being slower than the first clock rate.

10. The integrated circuit of claim 9, wherein the input/output buffer is further configured to receive second stimulus data after outputting the response data, and wherein the scan path is further configured to scan the second stimulus data at the first clock rate.

11. The integrated circuit of claim 9, wherein the first clock rate is 50 MHz and the second clock rate is 15 M/Hz.

12. The integrated circuit of claim 1, further comprising a plurality of input/output buffers comprising the input/output buffer.

13. The integrated circuit of claim 1, further comprising four pins coupled to the input/output buffer.

14. A method comprising:
- receiving, by an input/output buffer of an integrated circuit (IC), stimulus data;
- controlling, by a state machine of the IC, whether the input/output buffer operates as an input buffer or an output buffer;
- generating, by a logic circuit of the IC, response data, in response to the stimulus data;
- applying, by a scan path of the IC, the stimulus data to the logic circuit;
- applying, by the scan path of the IC, the response data to the input/output buffer; and
- outputting, by the input/output buffer of the IC, the response data.

15. The method of claim 14, further comprising configuring, by the state machine, the input/output buffer to operate as the input buffer in response to detecting an assertion of an external test pin.

16. The method of claim 15, further comprising configuring, by the state machine, the input/output buffer to operate as the output buffer in response to detecting deassertion of an external test pin.

17. The method of claim 14, wherein the input/output buffer initially operates as the output buffer, further comprising:
- counting, by a counter, a number of cycles of the stimulus data received from the input/output buffer; and
- transitioning, by the state machine, the input/output buffer to operate as the input buffer in response to determining that the counter reaches a predefined number of cycles.

18. The method of claim 14, wherein the input/output buffer initially operates as the input buffer, the method further comprising transitioning, by the state machine, the input/output buffer to operate as the output buffer in response to detecting a designated patter in the input/output buffer.

* * * * *